United States Patent [19]

Matsushita et al.

[11] Patent Number: 5,498,294
[45] Date of Patent: Mar. 12, 1996

[54] APPARATUS AND METHOD FOR WASHING SUBSTRATES

[75] Inventors: Michiaki Matsushita, Yatsushiro; Yutaka Yamahira, Kumamoto, both of Japan

[73] Assignees: Tokyo Electron Limited; Tokyo Electron Kyushu Limited, both of Japan

[21] Appl. No.: 154,964

[22] Filed: Nov. 19, 1993

[30] Foreign Application Priority Data

Nov. 20, 1992 [JP] Japan .................................. 4-335414

[51] Int. Cl.⁶ .............................. B08B 7/04; B08B 11/00
[52] U.S. Cl. ............................. 134/6; 134/18; 134/902; 15/21.1; 15/88.1; 15/88.2
[58] Field of Search .................... 134/18, 6, 902; 15/21.1, 88.1, 88.2, 88.3, 97.1

[56] References Cited

U.S. PATENT DOCUMENTS

| | | | |
|---|---|---|---|
| 5,081,733 | 1/1992 | Kudo | 15/88.3 X |
| 5,092,011 | 3/1992 | Gommori et al. | 15/88.2 X |
| 5,144,711 | 9/1992 | Gill, Jr. | 15/21.1 |
| 5,278,821 | 1/1994 | Kawamura et al. | 15/21.1 |
| 5,282,289 | 2/1994 | Hasegawa et al. | 15/21.1 |
| 5,345,639 | 9/1994 | Tanoue et al. | 15/88.2 |

FOREIGN PATENT DOCUMENTS

| | | |
|---|---|---|
| 62-47153 | 10/1987 | Japan . |
| 3-52226 | 3/1991 | Japan . |
| 3-52228 | 3/1991 | Japan . |
| 4-14494 | 3/1992 | Japan . |

Primary Examiner—Jan H. Silbaugh
Assistant Examiner—Saeed Chaudhry
Attorney, Agent, or Firm—Graham & James

[57] ABSTRACT

A substrates-cleaning apparatus including a first unit provided with a scrubber for scrubbing a single side of a substrate, a second unit provided with a turning mechanism for turning the substrate upside down or vice versa, and a carrier robot for carrying the substrate between the first and the second unit.

10 Claims, 11 Drawing Sheets

APPARATUS AND METHOD FOR WASHING SUBSTRATES

BACKGROUND OF THE INVENTION

1. Field of the Invention

The present invention relates to washing apparatus and method for scrubbing substrates such as semiconductor wafers by brushes and, more particularly, device and method for turning the substrates upside down or vice versa to scrub both surfaces of substrate.

2. Description of the Related Art

Various kinds of micro-process are added to substrates (such as semiconductor wafers and LCD substrates) in the course of manufacturing semiconductor devices, providing that the face surface of each substrate be already made clean. Each substrate, therefore, must be made clean on the face surface thereof before and between the micro-processes added. The face surface of each substrate is scrubbed (or brush-washed) by a scrubber prior to coating it with resist in the case of the photolithography, for example. When particles adhere to a reverse surface of the substrate, an excellent pattern cannot be formed on the face surface of the substrate when it is to be exposed, because it is held tilted. It is therefore usual to scrub both surfaces of the substrate.

Scrubbers of two types have been employed in the course of manufacturing semiconductor devices. One of them is the single side type scrubber intended to scrub only the single side of each substrate, and the other is the both-side type scrubber intended to scrub both surfaces of substrate at the same time. In the case of the single side type scrubber, the face surface of substrate is scrubbed by the brush, while rotating the substrate held on a spin chuck, to wash it clean with washing solution. In the case of the both-side type scrubber, the face surface and the reverse surface of substrate are scrubbed by brushes to wash them clean.

The single side scrubber has been used by the process of washing only the face surface of substrate and the both-side type scrubber by the process, such as the photolithography, of scrubbing the reverse surface of substrate as well as the face surface thereof. The both-side type scrubber, however, is intended to press the brushes against both surfaces of substrate and supply washing solution to them, while rotating the substrate. This makes the both-side type scrubber complicate and its cost high.

In order to solve these disadvantages of the conventional scrubbers, there has been provided a scrubber used as both for scrubbing the single-side and both-side. A pair of arms for turning substrates upside down or vice versa are arranged adjacent to spin chucks of the single- and both-side type scrubbers to enable the face surface and the reverse surface of substrate to be selectively or alternately scrubbed. In the case of this single- and both-side type scrubber, the arms pick up the substrate (or semiconductor wafer) from the spin chuck after the face surface of the substrate is scrubbed, turn it upside down at a position remote from the spin chuck, and transfer it onto the spin chuck. The face surface of substrate as well as the reverse surface thereof can be thus scrubbed by a single brush. In addition, the arms include the orientation flat aligning mechanism and the orientation flat of each substrate supported by the arms can be therefore aligned with a desired direction or position.

In the case of this single- and both-side type scrubber, however, one pair of arms conduct three functions for carrying-in and -out substrate, for turning substrate so as to vice versa, and for aligning its orientation flat with the predetermined direction or position. This makes the arm drive mechanism complicated in structure and the apparatus itself large in size accordingly. The face surface of substrate is scrubbed and, turning step and orientation flat aligning step must be carried out before the reverse surface of substrate is scrubbed. This makes the throughput of the washing process low.

Further, various kinds of drive means in each unit are susceptible to erosion, and excessive load is added to the drive motor. This leads the apparatus to malfuction.

SUMMARY OF THE INVENTION

An object of the present invention is therefore to provide a apparatus for washing substrate, simpler in structure and smaller in size, capable of scrubbing one surface of substrate and then turning it upside down to scrub the other surface of it.

Another object of the present invention is to provide a method capable of washing substrate at a higher throughput without bringing the apparatus into disorder.

According to an aspect of the present invention, there can be provided a substrates-washing apparatus comprising a first unit having scrubber means for scrubbing a single surface of a substrate; a second unit having turning means for turning the substrate upside down; and carrier means for carrying the substrate between the first and the second unit; so that one surface of the substrate is scrubbed by the scrubber means in the first unit, the substrate is carried from the first unit to the second unit by the carrier means, the substrate is turned upside down by the turning means in the second unit, the substrate is carried from the second unit to the first unit by the carrier means, and an other surface of the substrate is scrubbed by the scrubber means.

According to another aspect of the present invention, there can be provided a method for washing substrate comprising preparing scrubber means for scrubbing a single surface of a substrate, stage means on which the substrate is mounted, carrier means for carrying the substrate between the stage mean and the scrubber means, and turning means for turning the substrate; scrubbing one surface of said substrate by the scrubber means; carrying the substrate from the scrubber means to the stage means by the carrier means; picking the substrate up from the stage means and turning the substrate by the turning means; returning the substrate from the turning means to the stage means; carrying the substrate from the stage means to the scrubber means by the carrier means; and scrubbing an other surface of the substrate by the scrubber means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

A case where a substrates-washing apparatus of the present invention is applied to the system for scrubbing and resist-coating semiconductor wafers will be described with reference to the accompanying drawings.

Figure 1:
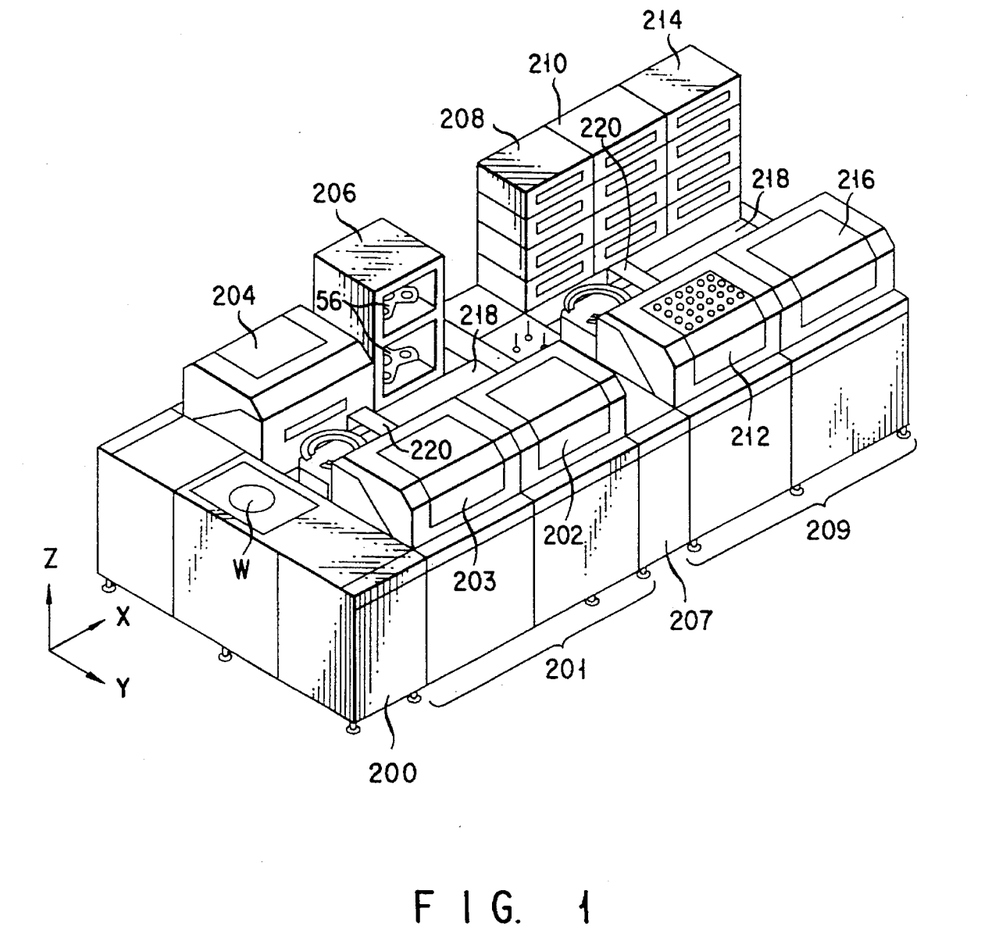
FIG. 1 is a perspective view showing the whole of the scrubbing/resist coating system.

As shown in FIG. 1, the scrubbing and resist-coating system includes a loader/unloader section 200, a first process section 201, an interface section 207 and a second process section 209. A passage 218 extends along the center line and in the longitudinal direction of the system. Carrier robots 220 run on the passage 218 at the first and second process sections 201 and 209. An 8-inch silicon wafer W is carried to the loader/unloader section 200 by a robot (not shown) and then from the loader/unloader section 200 to the first process section 201 by the carrier robot 220. Each of units 200–216 is arranged along the passage 218, each front side of units 200–216 is faced to the passage 218, respectively. A wafer transferring mechanism is provided at the interface section 207 to transfer the wafer a between the carrier robots 220 at the first and second process sections 201 and 209.

Two scrubbing units 202, 203, an adhesion process unit 204 and a turning unit 206 are provided in the first process section 201. Each of the scrubbing units 202 and 203 includes a rotary brush and a spin chuck and the wafer is spun by the spin chuck while pressing the rotary brush only to one surface of the wafer W. The single-side type scrubber is disclosed in Jpn. Pat. Appln. KOKAI Publication Nos. Hei 3-52226 and Jpn. Pat. Appln. KOKAI Publication Nos. Hei 3-52228.

The second process section 209 includes drying unit 208, cooling unit 210, resist coating unit 212, heat processing unit 214 and resist removing unit 216. The wafers are baked in the heat process unit 214 before and after they are coated with resist. Resist is removed from the peripheral portion of each of them in the resist removing unit 216.

The turning unit 206 will be described in detail, referring to FIGS. 2 through 6.

The turning unit 206 is enclosed by panel walls 3, 4, 5 and 6 each made of stainless steel. The panel walls 3, 4, 5, 6 and a ceiling panel are supported by four main poles 2.

Figure 2:
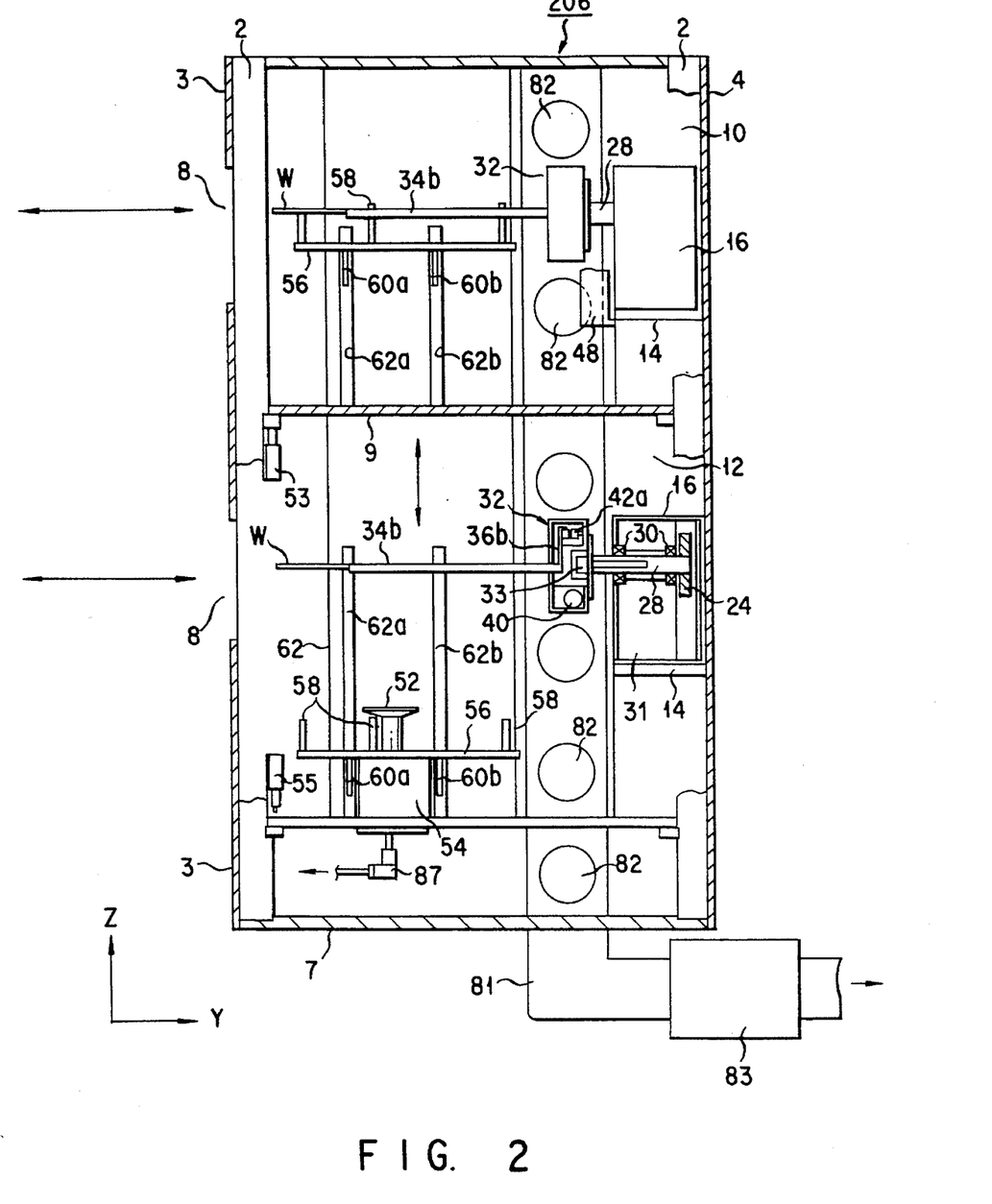
FIG. 2 is a perspective side view showing a turning unit sectioned.
Figure 3:
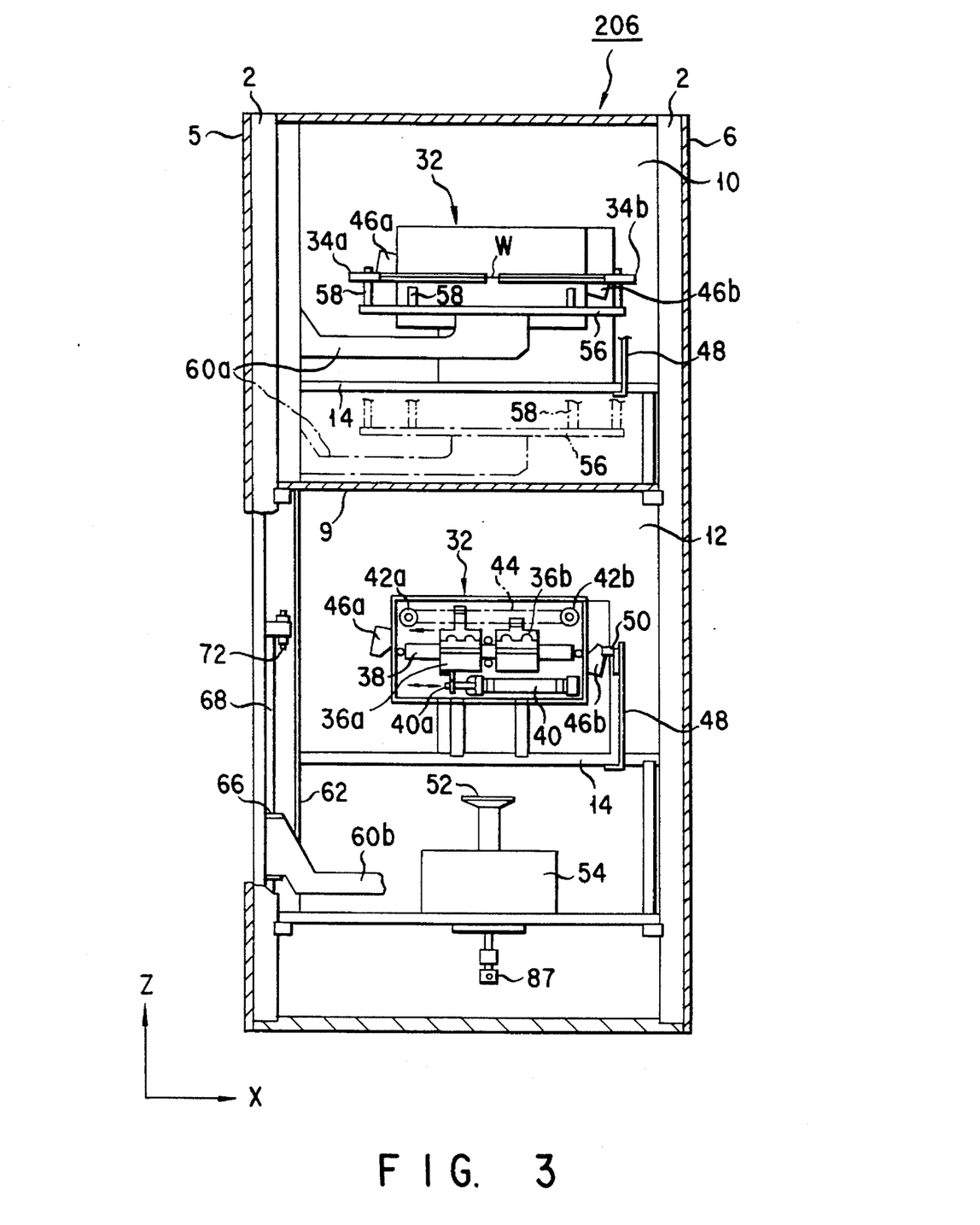
FIG. 3 is a perspective front view showing the turning unit sectioned.

As shown in FIGS. 2 and 3, the turning unit 206 is separated from upper and lower chambers 10 and 12 by a partition plate 9. An exhaust duct 81 extends in the turning unit 206, passing through the upper and lower chambers 10 and 12 and communicating with them through plural openings 82. It is communicated at its base end with a blower 83 and then with the exhaust system (not shown) in the factory. The exhaust duct 81 is a rectangular pipe made of stainless steel.

Wafer carrying-in and -out openings 8 are formed in the front panel wall 3 and the wafers W are carried in and out of the upper and lower chambers 10 and 12 through them. A stage 56 and a turning mechanism 16 are arranged in each of the upper and lower chambers 10 and 12. A spin chuck 52 is also arranged in the lower chamber 12 and its pipe 87 is communicated with vacuum pump (not shown) to attract and hold the wafer W on it.

Figure 6:
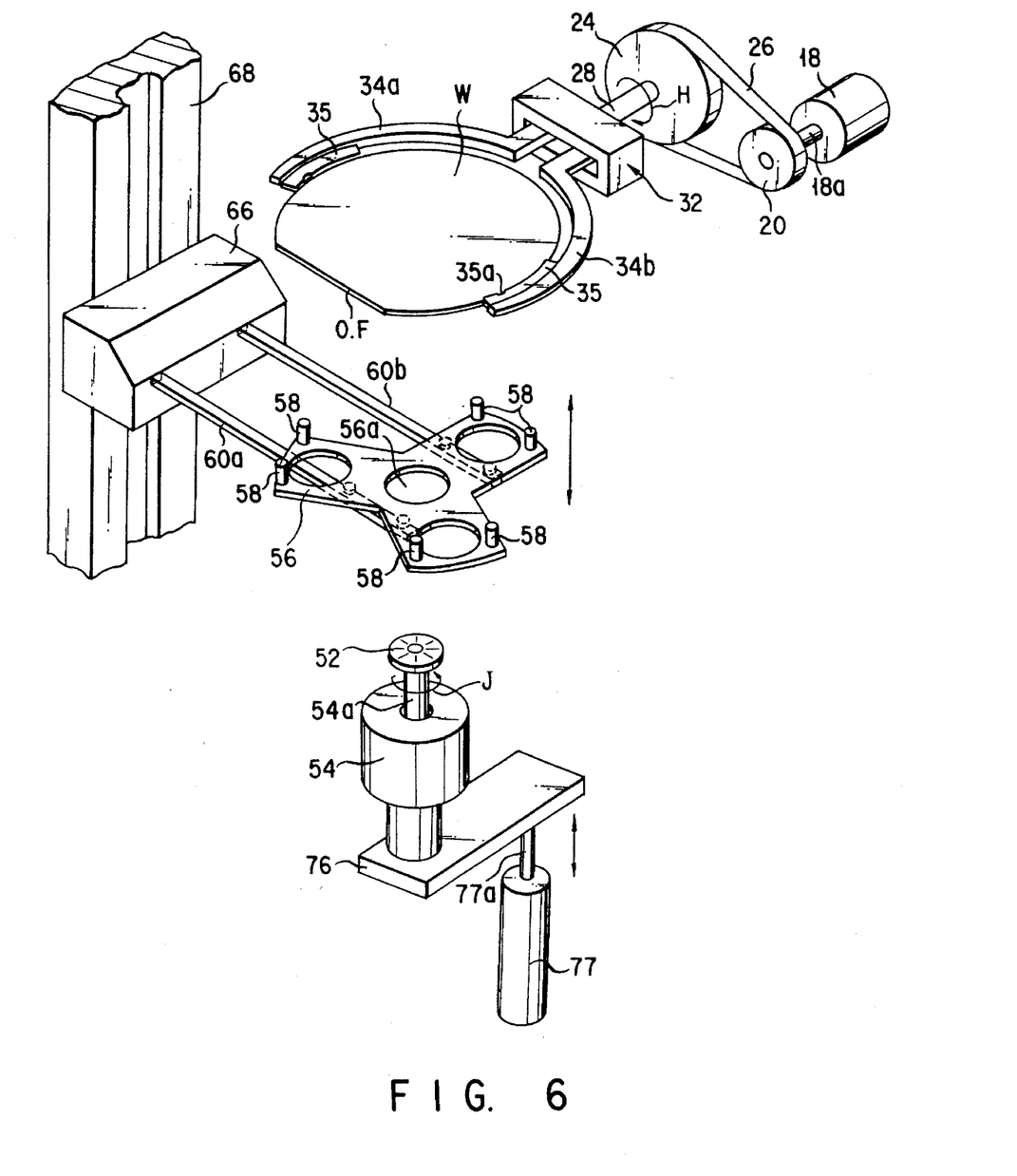
FIG. 6 is a perspective view showing various kinds of mechanism in the turning unit dismantled.

As shown in FIG. 6, the spin chuck 52 is connected to a motor shaft 54a in a case 54. It is supported by a support member 76, which is connected to a lifting rod 77a. The case 54 and an air cylinder 77 are controlled by a controller (not shown) backed up by a computer system. The stage 56 is connected to a lifter mechanism 66 through support rods 60a and 60b and the drive section of the lifter mechanism 66 is fitted into a groove of a linear guide 68 which is fixed to the side panel wall 5. An opening 56a allows the spin chuck 52 to pass through the stage 56 and both of them, therefore, do not interfere with each other when they are crossing the other.

Figure 4:
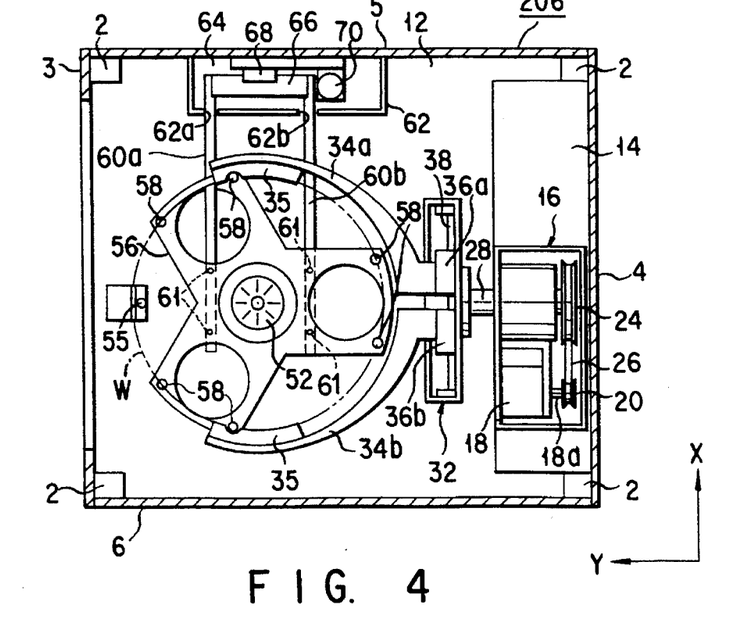
FIG. 4 is a perspective plan showing the turning unit sectioned.
Figure 5:
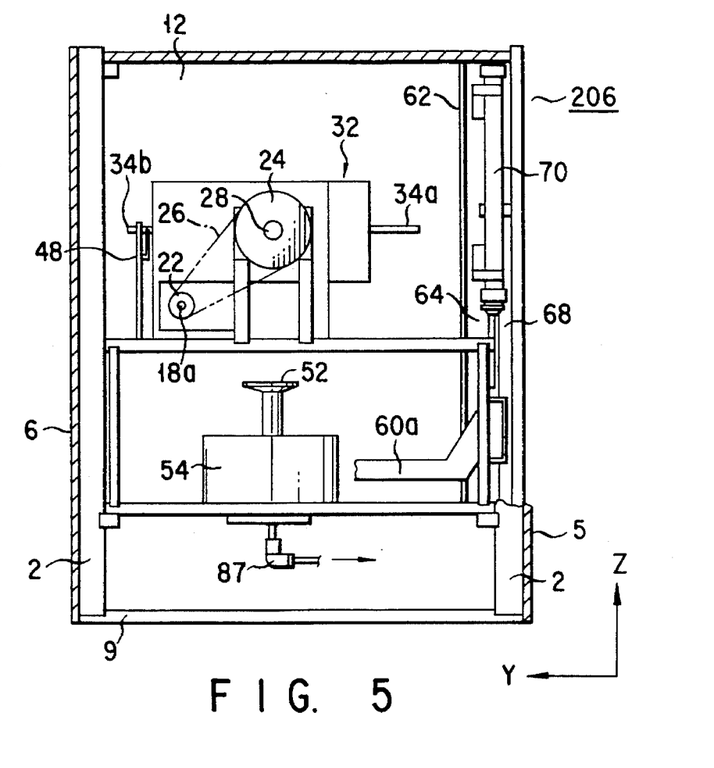
FIG. 5 is a perspective side view showing a lower chamber of the turning unit sectioned.

As shown in FIGS. 2, 4 and 5, the turning mechanism 16 is arranged on the side of the rear panel wall 4 in each of the chambers 10 and 12. It is mounted on a support plate 14 and it is a combination of belt and cylinder/belt mechanisms. Its belt mechanism comprises a motor 18, pulleys 20, 24 and a belt 26 while its cylinder/belt mechanism comprises a pair of arm supports 36a, 36b, an air cylinder 40, pulleys 42a, 42b and a belt 44. The pulleys 20 and 24 are attached to motor drive shaft 18a and a transmission shaft 28 and the belt 26 is stretched between the pulleys 20 and 24. The rotation of the motor 18 as transmitted to wafer chucks 34a and 34b by the transmission shaft 28. The arm supports 36a and 36b of the cylinder/belt mechanism come remoter from each other as a rod 40a comes out of the cylinder 40, but they come nearer to each other as the rod 40a retracts into the cylinder 40. The transmission shaft 28 is rotatably supported by a support block 31 in the turning mechanism 16 through bearings 30. An arm drive section 32 is attached to the front end of the transmission shaft 28 by a bolt 33.

As shown in FIGS. 2 through 4, the arm drive section 32 houses the arm supports 36a, 36b, a guide rod 38 and the cylinder 40 therein. The arm supports 36a and 36b are attached to base ends of the semicircular wafer holding arms 34a and 34b. The guide rod 38 supports the arm supports 36a and 36b movable in a direction X.

As shown in FIG. 3, the arm supports 36a and 36b are fixed to the upper and lower portions of the belt 44 which is stretched between the paired pulleys 42a and 42b parallel to the horizontal guide rod 38. The front end of the piston rod 40a in the cylinder 40 is fixed to one arm support 36a. When they are under a state shown in FIG. 3, the arm supports 36a and 36b come near to each other to such an extent that the arms 34a and 34b can hold the wafer a between them. When the motor 18 of the turning mechanism 16 is made operative to rotate the transmission shaft 28, the arm drive section 32 and the wafer holding arms 34a, 34b are turned together with the transmission shaft 28.

A pair of shutter plates 46a and 46b are attached to both sides of the arm drive section 32. A photosensitive sensor 50 of the beam shielding type is attached to the top of a flange plate 48 erected from the support plate 14. The shutter plate 46a is usually at such a position that it can shield the optical axis of the photosensitive sensor 50. When the arm drive section 32 is turned from this state by 180°, the shutter plate 46a can shield again light beam shot from the photosensitive sensor 50. The motor 18 is controlled in such a way that the rotation of its shaft 28 can stop at this beam-shielded timing. The wafer holding arms 34a and 34b are turned by 180° and opened and closed to hold the wafer W, as described above, at a predetermined position in the lower chamber 12.

The spin chuck 52 is arranged just under the wafer holding arms 34a and 34b to align the orientation flat of the wafer a with a predetermined position. The case 54 is fixed to the bottom of the lower chamber 12.

As shown in FIGS. 2 and 4, light-emitting and -receiving elements 53 and 55 are attached, facing each other, to the main poles 2 on the front side of the lower chamber 12. They are arranged to put their optical axes on a same line and they cooperate with each other to provide a photosensitive sensor. The orientation flat of the wafer W can be aligned with the predetermined position by monitoring whether or not light emitted from the light-emitting element 53 is received by the light-receiving element 55 while rotating the wafer W on the spin chuck 52.

The stage 56 is arranged, movable in a direction Z, between the wafer holding arms 34a, 34b and the spin chuck 52. As shown in FIG. 4, the stage 56 comprises a center portion, each of three plate-like portions extending outward from the center portion at an angle of 120°, and two support pins 58 erected on the front end of each of the three plate-like portions to support the peripheral portion of the wafer a thereon. Wafwe contact members 35 of the arms 34a and 34b have cut-away portions 35a not to cause the support pins 58 to interfere with the arms 34a and 34b. The center portion of the stage 56 has the center opening 56 through which the spin chuck 52 can pass. The stage 56 is supported by the paired support arms 60a and 60b which extend from the side panel wall 5. These support arms 60a and 60b is moved up and down by a lifter drive section 64 housed in a cover 62. Two pins 61 are erected on each of the support arms 60a and 60b to support the stage 56 thereon. Those members 35, 58, 220a and 220b which are contacted directly with the wafer W are made of synthetic resin.

As shown in FIGS. 4 and 5, the lifter drive section 64 includes the lifter mechanism or block 66, the guide 68 and a cylinder 70. The guide 68 is intended to guide the block 66 in the direction Z. A piston rod 70a of the cylinder 70 is fixed to the block 66 at its front end. The cover 62 has a pair of vertical grooves 62a and 62b along which the support arms 60a and 60b can move up and down.

The stage 56 is moved up and down from a first to a third position. When it is at the first position, the wafer a can be transferred between the arms 34a, 34b and it. When it is at the second position (between the first and the third position), the wafer can be transferred between the carrier robot 220 of the turning unit 206 and it. When it is at the third position, the turning of the wafer a is made possible or the wafer W can be transferred between the spin chuck 52 and it. A shock absorber or stopper 72 is arranged above the block 66 to allow the block 66 to be lifted until it strikes against the stopper 72. This enables the stage 56 to be more quickly and accurately set at the first position.

The upper chamber 10 of the turning unit 206 is substantially same in arrangement as the lower one thereof, except that no orientation flat alignment mechanism including the spin chuck 52 is provided. In short, the arms 34a, 34b, the turning drive section 16, the arm drive 32 and the stage 56 in the upper chamber 10 are same as those in the lower chamber 12. The stage 56 is also moved up and down from the first position (where it is shown by solid lines) to the third position (where it is shown by two-dot and a dash lines). Only the turning of the wafer W as therefore carried out in the upper chamber 10 of the turning unit 206.

Figure 7A:
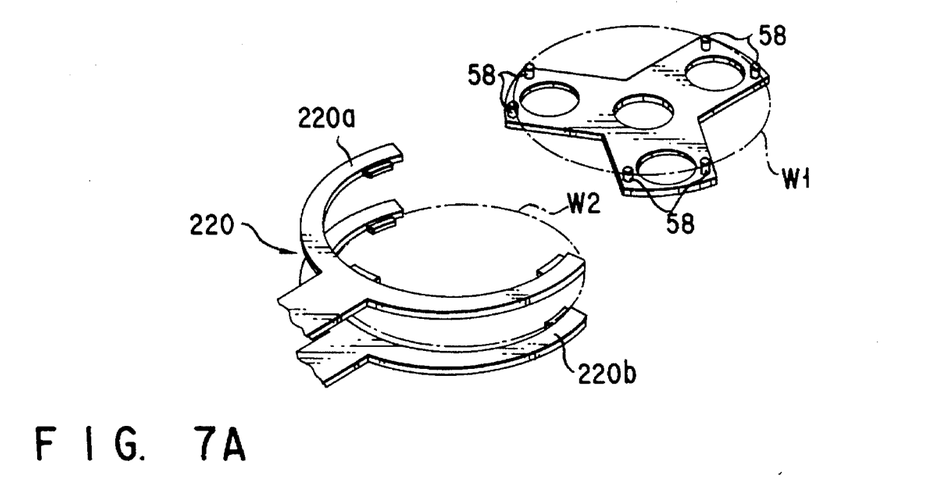
FIGS. 7A through 7F are perspective views showing a turning mechanism and a lafter stage dismantled to explain how each substrate is turned upside down and vice versa.

A series of operations in the above-described system will be described with reference to FIGS. 6 through 8.

When the wafer W is carried from the loader/unloader section 200 into the first process section 201, it is scrubbed on its both front and rear sides by the scrubber units 202 and 203. It is further processed hydrophobic by the adhesion unit 204 and then coated with resist by the resist coating unit 212. After and before or between these main processes, additional operations or processes are added to it by the turning, drying, cooling, heating and resist removing units 206, 208, 210, 214 and 216.

That front side of a wafer $W_1$ which is to be coated with resist) is scrubbed in the first scrubber unit 202 (Step 1) and the wafer $W_1$ is then carried out of the unit 202 by the carrier robot 220 (Step 2). When it is carried into the lower chamber 12 of the turning unit 206, another wafer $W_2$ which has been turned upside down and whose orientation flat has been aligned with the predetermined position is transferred from the stage 56 to the lower arm 220b (Step 3). The wafer $W_1$ is then transferred, as shown in FIG. 7A, to the stage 56 which is waiting at its second position. The wafer $W_1$ is kept upside up but the wafer $W_2$ has been turned upside down at this time. While holding them in this manner, they are exchanged with each other from the stage 56 to the lower arm 220b and from the upper arm 220a to the stage 56 (Step 4). The wafer $W_1$ is then carried to steps 5–12 which will be described later, while the wafer $W_2$ to steps 13–22 which will be described later.

Figure 7B:
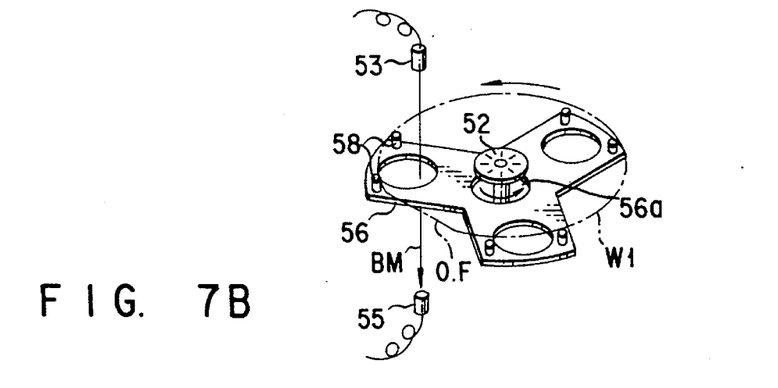
Figure 8:
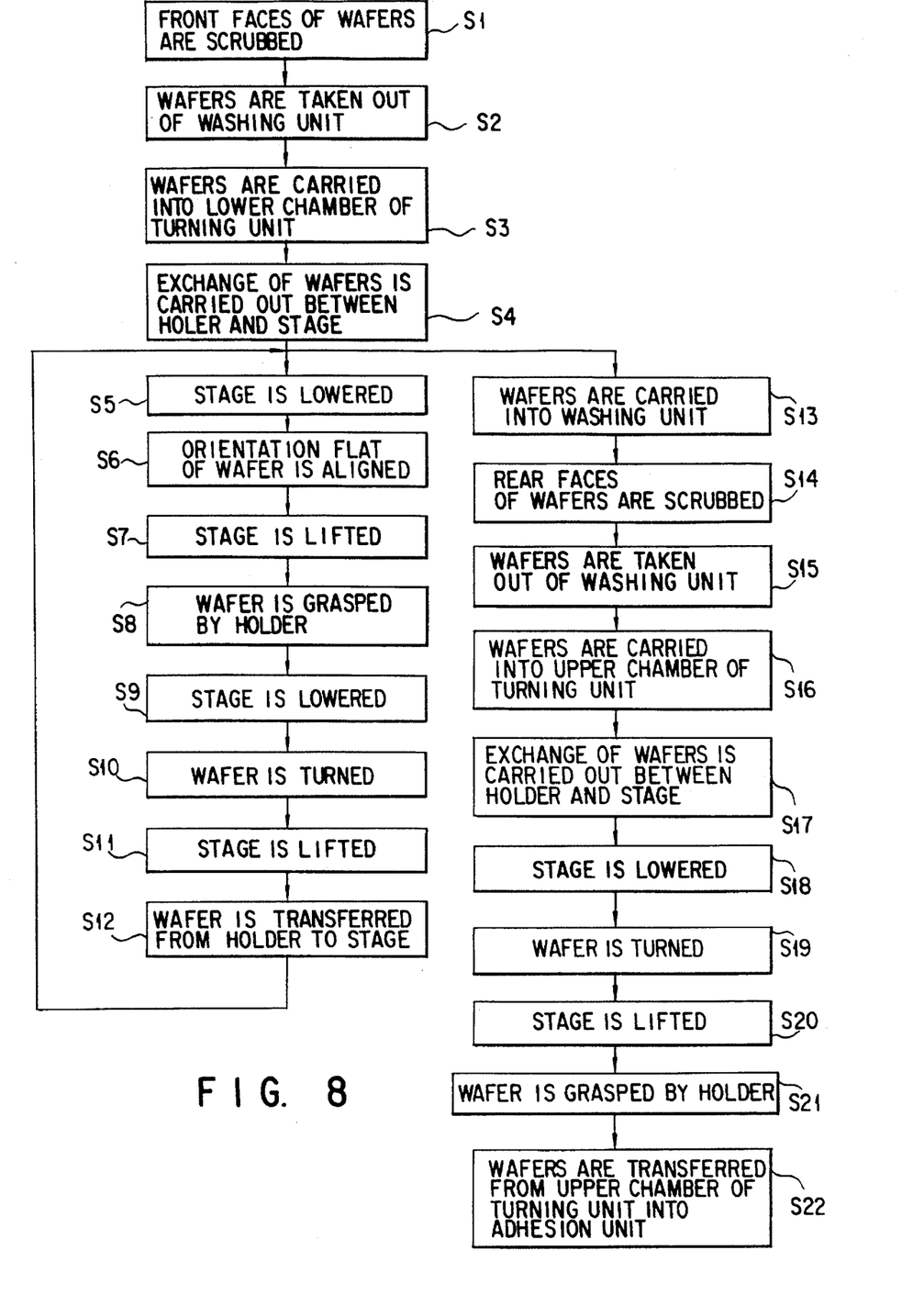
FIG. 8 is a flow chart showing a series of cleaning steps in which each wafer is turned upside down and vice versa.

While lowering the stage 56 to its third position, the wafer $W_1$ is transferred from the stage 56 onto the spin chuck 52, as shown in FIG. 7B (Step 5). Light beam is shot from the light-emitting element 53 to the light-receiving element 55, while rotating the spin chuck 52. When the center of the orientation flat of the wafer $W_1$ comes nearest to the light beam BM, the light beam BM is allowed to pass outside the orientation flat of the wafer $W_1$ and received by the light-receiving element 55. Light detection signal is thus applied to the controller, by which the rotation of the spin chuck 52 is stopped (Step 6). When the alignment of the orientation flat of the wafer $W_1$ is thus finished, the stage 56 is lifted and the wafer $W_1$ is transferred from the spin chuck 52 to the stage 56 (Step 7).

Figure 7C:
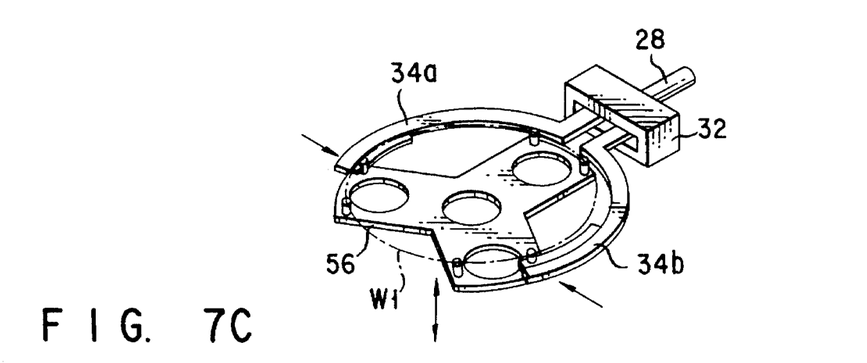

As shown in FIG. 7C, the stage 56 is lifted to its first position and the wafer $W_1$ is transferred from the stage 56 to the wafer holding arms 34a and 34b. The wafer $W_1$ is thus held by the holder arms 34a and 34b (Step 8). The stage 56 is then lowered to its third position (Step 9).

Figure 7D:
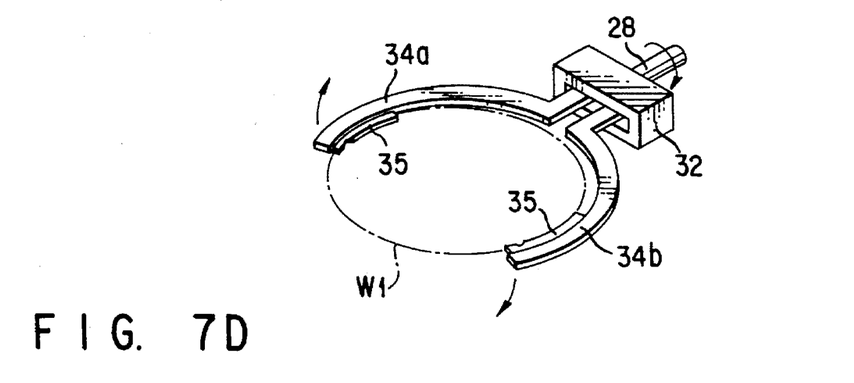

The holder arms 34a and 34b are turned round the transmission shaft 28 to hold the wafer $W_1$ upside down, as shown in FIG. 7D (Step 10). The stage 56 is again lifted to its first position (Step 11).

Figure 7E:
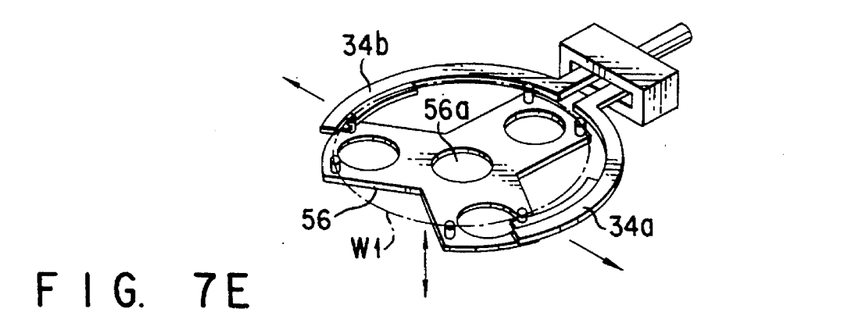

As shown in FIG. 7E, the holder arms 34a and 34b are driven to separate from each other and the wafer W₁ is thus transferred from the holder arms 34a and 34b to the stage 56 (Step 12). The stage 56 is lowered to its second position and kept waiting there while holding the wafer W₁ thereon until the carrier robot 220 comes near to the stage 56.

While the turning of the wafer W₁ and the aligning of its orientation flat are carried out, as described above, in the lower chamber 12 of the turning unit 206, the wafer W₂ is carried into the first scrubber unit 202 (Step 13) and its underside is scrubbed (Step 14). A wafer W₃ whose top side is held upside is carried into the second scrubber unit 203 and its top side is scrubbed. The wafer W₂ whose underside has made clean is carried out of the first scrubber unit 202 (Step 15) and then into the upper chamber 10 of the turning unit 206 (Step 16).

Figure 7F:
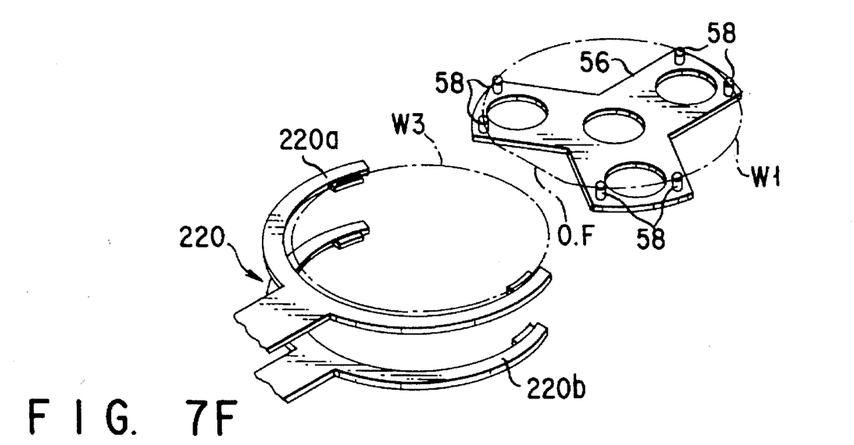

The wafer W₃ whose top side has been cleaned is carried out of the second scrubber unit 203 and into the lower chamber 12 of the turning unit 206. It is then carried to the stage 56 which is kept waiting at its second position, as shown in FIG. 7F. The wafer W₁ which has been turned and whose orientation flat has been aligned is transferred from the stage 56 to the lower arm 220h while the wafer W₃ from the upper arm 220a to the stage 56 (Step 17). The wafer W₁ is held upside down and the wafer W₃ upside up at this time. The wafer W₃ is turned upside down and carried to the first or second scrubber unit 202 or 203 where its underside is scrubbed.

On the other hand, the stage 56 is lowered while holding the wafer W₁ by the holder arms 34a and 34b (Step 18). The wafer W₁ is then turned upside up (Step 19). It is transferred from the holder arms 34a and 34b to the stage 56 while lifting the stage 56 (Step 20). It is further transferred from the stage 56 to the lower holder 220b of the carrier robot 220 (Step 21) and carried from the upper chamber 10 of the turning unit 206 into the adhesion unit 204 (Step 22).

According to the above-described embodiment, the single-side scrubbing operations in the two scrubber units 202 and 203 are carried out in parallel with the wafers turning operations in the upper and lower chambers 10 and 12 of the turning unit 206 at the same time. This enables the throughput of wafers cleaning process to be increased to a greater extent. In addition, the single-side scrubber used in each of the scrubber units 202 and 203 is quite simple in structure, thereby making its cost low.

Although two scrubber units 202 and 203 have been combined with one turning unit 206 in the above-described case, the number of the scrubber and turning units combined may be optional or as desired.

If necessary, the turning unit may consist of the upper chambers (in which only the turning of wafers is conducted) or the lower chambers (in which the turning of wafers and the aligning of their orientation flats are conducted). The present invention may be applied not only to the semiconductor wafers but also to LCD substrates. Further, it may be applied not only to the scrubber units 202 and 203 of the single-side cleaning type but also to the cleaning system in which the other units of the single-side cleaning type are used.

Furthermore, the transferring of wafers between the carrier robot 220 and the stage 56 may be conducted not only at the second position but also at the first position. Adjustment and maintenance may be added to the stage 56 at the second position when the wafers transferring is conducted at the first position, or the second position may not be employed.

Figure 9:
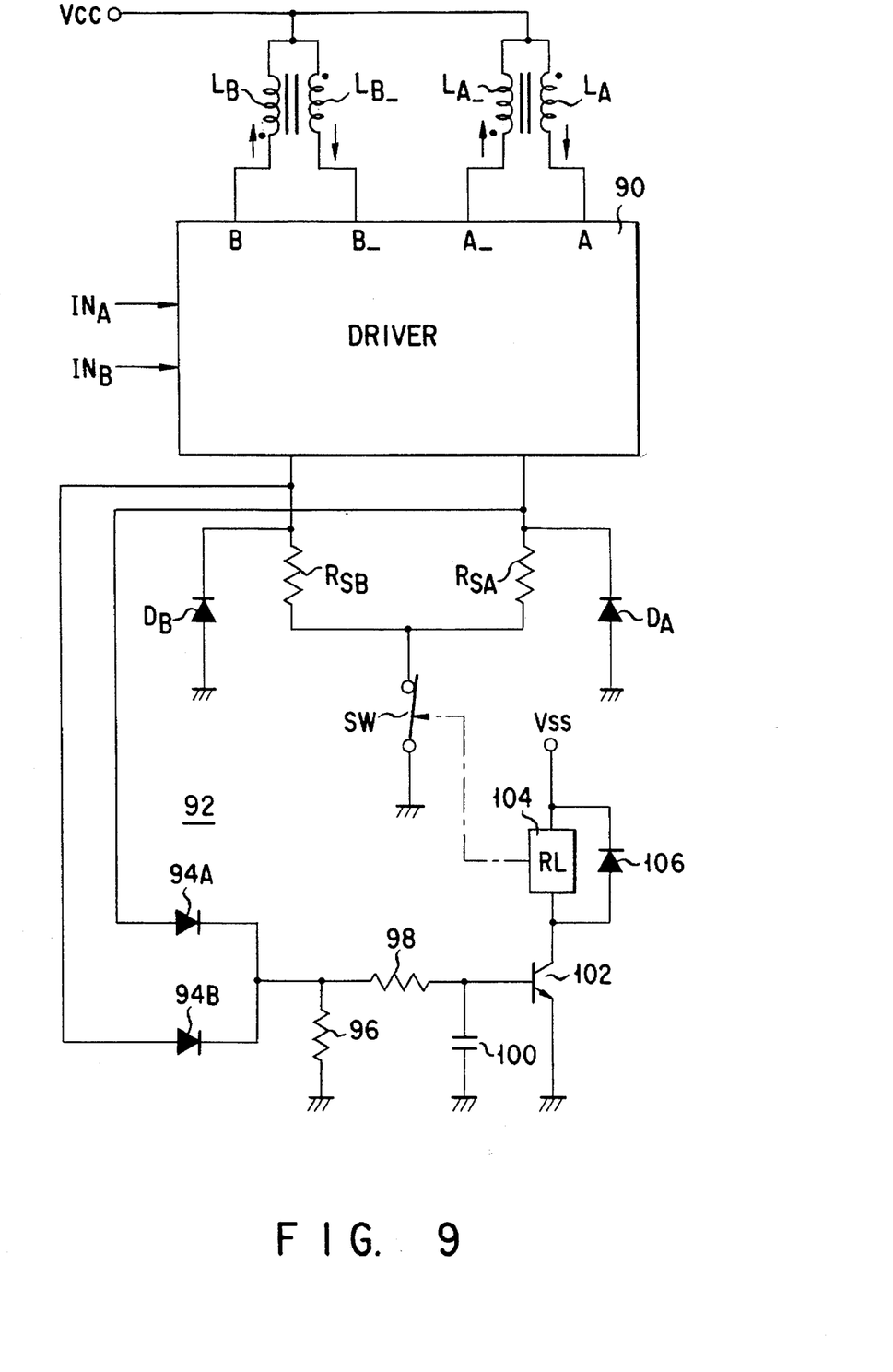
FIG. 9 is a block diagram showing a stepping motor drive circuit.
Figure 10:
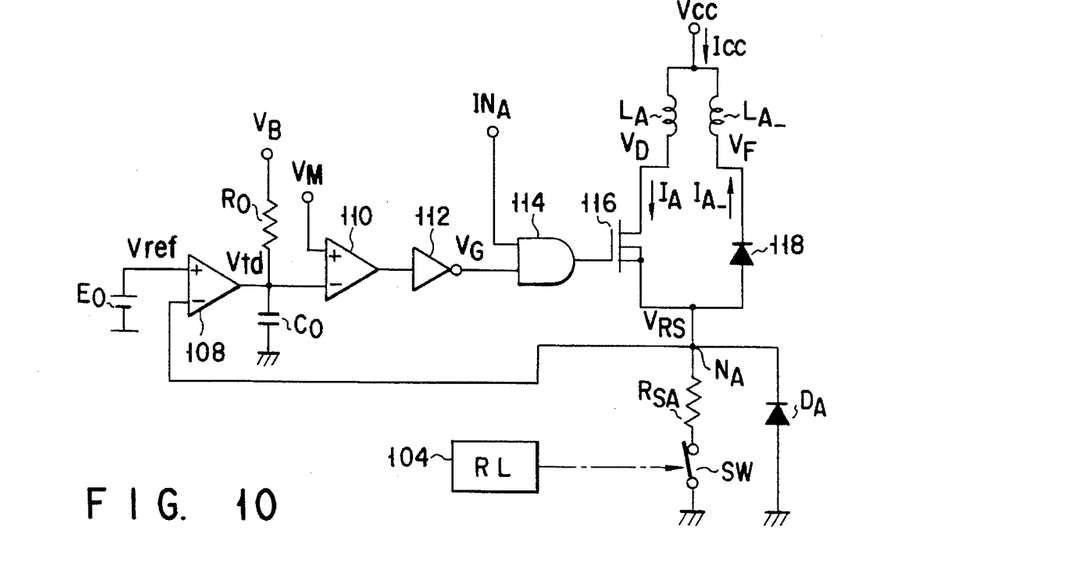
FIG. 10 is a circuit diagram showing a drive section of A and A- phases in the stepping motor drive circuit.
Figure 11:
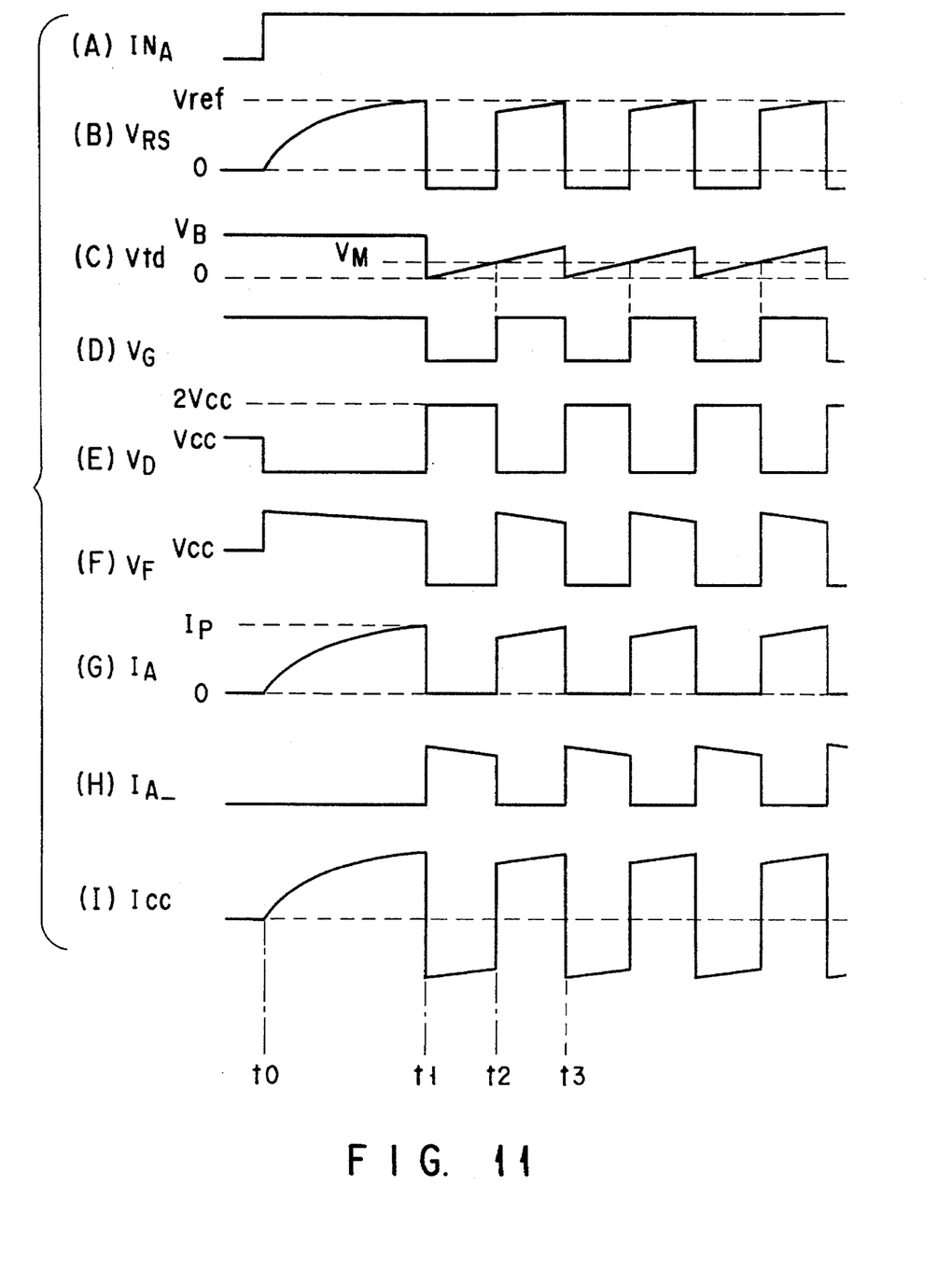
FIG. 11 shows characteristic waveforms (A)–(I) of voltage and current at some points of the circuit to explain how the drive section is operated at normal time.

Referring to FIGS. 9 through 11, it will be now described how the drive section of the carrier robot is controlled.

The stepping motor is used for the drive section of the carrier robot 220. It is driven by various manners, but it is usually driven by the constant-current drive manner of the chopper type in a case where high speed rotation is needed. According to this constant-current drive manner of the chopper type, the drive transistor as turned on and off (or chopper-controlled) every clock pulse by high frequency. As the result, motor wirings are excited by large drive current to attain high torque. In the case of the conventional stepping motor chopper-controlled, however, overcurrent continues to flow to a drive transistor $D_A$ when chopping operation is made imoperative because of noises and heat. The drive transistor $D_A$ is thus broken. In the case of a stepping motor drive circuit according to the present invention, therefore, this overcurrent is stopped as soon as possible to protect the drive transistor $D_A$.

The stepping motor drive circuit is of the four-phase type having wirings (or excited coils) of A, A-, B and B- phases, as shown in FIG. 9. Synchronizing with clock signal, tow exciting signal INA and INB which determine the type of excitation (2-phase or 1–2 phase excitation) are applied from the micro-computer (not shown) to a driver 90. Responsive to logical values of the exciting signals INA and INB, the driver 90 applied chopping-controlled exciting currents IA, IA-, IB and IB- to excited coils $L_A$, $L_{A-}$, LB and LB- at a predetermined sequence. A pair of a resistance $R_{SA}$ and a flywheel diode $D_A$ for A and A- phases and another pair of a resistance $R_{SB}$ and a flywheel diode $D_B$ for B and B-phases are externally connected to the driver 90. This arrangement is common to conventional drive circuits usually used.

In the case of this embodiment, one ends or earth ends of the externally-connected resistances $R_{SA}$ and $R_{SB}$ are earthed through a switch SW, and a switch control circuit 92 is provided to control the switch SW. The switch control circuit 92 includes diodes 94A, 94B and a resistance 96; a resistance 98 and a capacitor 100; a transistor 102; a relay 104; and a protection diode 106. The diodes 94A, 94B and the resistance 96 are intended to detect current flowing to the externally-connected resistances $R_{SA}$ and $R_{SB}$. The resistance 98 and the capacitor 100 form a delay circuit. The transistor 102 is intended to control the switch SW responsive to current flowing to the externally-connected resistances $R_{SA}$ and $R_{SB}$. The relay 104 is intended to turn on and off the switch SW.

FIG. 10 shows a circuit arrangement of the drive section for the excited coils LA and LA- of A and A-phases. In the case of this drive section, the driver 90 houses, as an integrated circuit, comparators 108, 110, an inversion circuit 112, an AND circuit 114, a MOSFET (or drive transistor) 116 and a flywheel diode 118. The drive section for the excited coils LB and LB- of B and B- phases is same in arrangement and operation as the one of A and A- phases, but different only in phase. The drive section of A and A- phases will be described below.

The switch SW is usually closed to allow exciting current to flow through it. One terminal of the externally-connected resistance $R_{SA}$ is earthed through the switch SW and the other terminal thereof is connected to the excited coil LA- of the A- phase in series via the FET 116, the A-phase excited coil LA, and the flywheel diode 118. It is further connected to the inversion input terminal of the comparator 108. First reference voltage Vref is applied from a reference voltage generator circuit $E_0$ to the non-inversion terminal of the comparator 108. The output terminal of the comparator 108 as connected to the inversion input terminal of the comparator 110 via a time constant circuit which comprises a resistance $R_0$ and a capacitor $C_0$. Second reference voltage $V_M$ is applied from the reference voltage generator circuit (not shown) to the non-inversion input terminal of the comparator 108. The output terminal of the comparator 110 is connected to one input terminal of the AND circuit 114 via the inversion circuit 112. Exciting signal $IN_A$ is applied to the other input terminal of the AND circuit 114. The output terminal of the AND circuit 114 is connected to the gate terminal of the FET 116.

Referring to (A)–(I) in FIG. 11, it will be described how the drive section of the A and A- phases is operated.

As shown in (A) of FIG. 11, the output terminal of the AND circuit 114 becomes low in level and the FET 116 is turned on when exciting signal $IN_A$ becomes high in level at a start time $t_0$ of a clock period. Exciting current $I_A$, therefore, begins to flow to the excited coil $L_A'$ as shown in (G) of FIG. 11. As this exciting current $I_A$ rises' voltage $V_{RS}$ obtained at the current detecting terminal $N_A$ of the resistance $R_{SA}$ also rises, as shown in (B) of FIG. 11.

When this voltage $V_{RS}$ becomes equal to first reference voltage Vref at a time t1, output voltage Vtd of the comparator 108 is inverted from high level ($V_B$) to low level (0), as shown in (C) of FIG. 11. Output voltage of the comparator 110 is inverted from low to high in level and output voltage $V_G$ of the inversion circuit 112 from high to low in level, as shown in (C) of FIG. 11. As shown in (G) of FIG. 11, therefore, output voltage of the AND circuit 114 becomes low in level and the FET 116 is turned off. Exciting current $I_A$ is thus stopped.

When the FET 116 is turned off, counter electromotive force is generated in the excited coil $L_{A^-}$ and exciting current $I_{A^-}$ is caused to flow from earthed side to the excited coil $L_{A^-}$ via the resistance $R_{SA}$ and the flywheel diode 118 by this counter electromotive force, as shown in (H) of FIG. 11. Current detecting voltage $V_{RS}$ of the current detecting terminal $N_A$ therefore, falls sharply from first reference voltage Vref to negative one.

On the other hand, output voltage Vtd of the comparator 108 falls to low in level at the time t1 and then gradually rises as the capacitor $C_0$ is charged, as shown in (C) of FIG. 11. When this voltage Vtd becomes larger than second reference voltage $V_M$ at a time t2, output voltages of the comparator 110, inversion circuit 112 and AND circuit 114 are inverted and the FET 116 is turned on, as shown in (D) of FIG. 11. When the FET 116 is turned on, exciting current $I_A$ begins to flow to the side of A phase and exciting current $I_{A^-}$ to the side of A- phase is stopped at the same time, as shown in (G) and (H) of FIG. 11.

When exciting current $I_A$ to the side of A phase begins to flow at the time t2, as shown in (B) of FIG. 11, current detecting voltage $V_{RS}$ of the current detecting terminal $N_A$ rises sharply to positive one and it rises as exciting current $I_A$ becomes larger and larger. When current detecting voltage $V_{RS}$ reaches first reference voltage Vref at a time t3, output voltage Vtd of the comparator 108 is again inverted from high in level ($V_B$) to low in level (0), as shown in (C) of FIG. 11, and the same process as described above is repeated thereafter.

When the FET 116 is on- and off-controlled (or chopper-controlled) in the period of one clock pulse by a certing frequency, as described above, certain exciting currents $I_A$ and $I_{A^-}$ are allowed to flow to the excited coils $L_A$ and $L_{A^-}$.

Figure 12A:
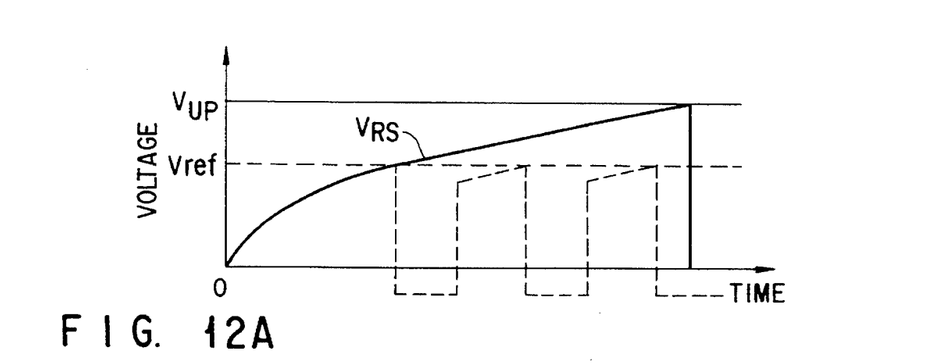
FIGS. 12A and 12B show characteristic waveforms representing current detecting voltage and exciting current to explain how the drive section is operated in abnormal case.
Figure 12B:
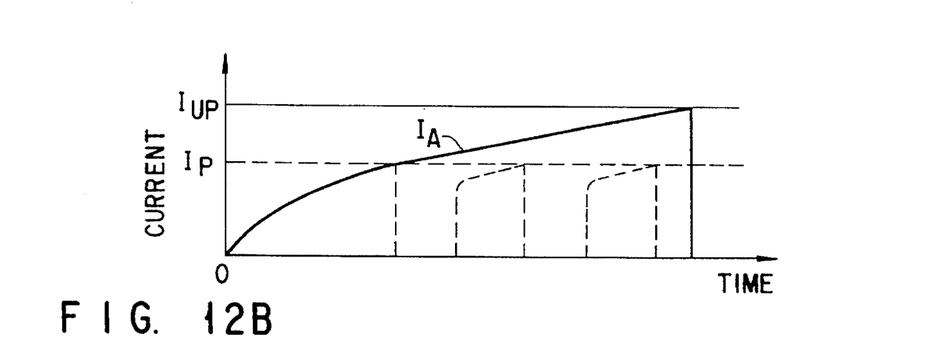

This chopper control is attained by the oscillator circuit in the drive section, but no oscillation is sometimes obtained from the oscillator circuit because of noises and heat. When the FET 116 is kept on-state in this case, exciting current $I_A$ continues to flow and current detecting voltage $V_{RS}$ also continues to rise, as shown in FIGS. 12A and 12B. In the case of the above-described drive circuit, however, overcurrent does not continue to flow to the FET 116 and this prevents the FET 116 from being broken.

The above-described drive control circuit may be applied to the drive motor 18 of the turning unit 206 and to the stepping motor housed in the chuck case 54.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An apparatus for washing a substrate, comprising:

scrubber means for scrubbing a single surface of the substrate;

a first unit having the scrubber means disposed therein;

turning means, having a horizontal holding shaft for holding a substrate substantially horizontal, for turning the substrate about the horizontal holding shaft to cause front and back surfaces of the substrate to face upward alternately;

a second unit having the turning means disposed therein;

carrier means for carrying the substrate between the first and second units; and a stage for mounting a substrate thereon, the stage being movable in a vertical direction within the second unit, thus enabling the substrate to be transferred between the carrier means and the turning means via the stage, wherein the front surface of the substrate is scrubbed by the scrubber means, the substrate is carried by the carrier means from the first unit to the second unit, the substrate is turned upside down by the turning means, the substrate is carried by the carrier means from the second unit to the first unit, and the back surface of the substrate is then scrubbed by the scrubber means.

2. The apparatus according to claim 1 further comprising:

a spin chuck mounted below the stage such that, when the stage is moved downward, the spin chuck passes smoothly through a central opening of the stage so as to attract the substrate thereon;

means for rotating the spin chuck;

a photosensitive sensor for detecting whether or not an orientation flat of the substrate is aligned; and control means for controlling the rotating means based on a signal generated from the photosensitive sensor, wherein the spin chuck is lifted and passes through the central opening of the stage, the substrate is transferred from the stage to the spin chuck and, while the substrate is rotating, the substrate is detected by the photosensitive sensor to align the orientation flat.

3. The apparatus according to claim 1, wherein said turning means includes a pair of holder members for holding the substrate therebetween, a stepping motor for rotating the substrate together with the holder members round the horizontal holding shaft, and a motor drive circuit for driving an excited coil of each phase of the stepping motor; and wherein said motor drive circuit includes means for detecting exciting current flowing to drive for enabling and shutting the flow of the excited coils, a switch for enabling and shutting the flow of the exciting current, and switch control means for turning on the switch to shut the flow of exciting current when the value of the exciting current detected by the exciting current detector means becomes equal to a threshold value.

4. The apparatus according to claim 1, wherein said carrier means includes a pair of holder members for holding the substrate therebetween, a rod connected to these holder members, a stepping motor for rotating the substrate together with the holder members around the rod, and a motor drive circuit for driving an excited coil of each phase of the stepping motor; and wherein said motor drive circuit includes means for detecting exciting current flowing to drive transistors connected to the excited coils, a switch for enabling and shutting the flow of the exciting current, and a switch control means for turning on the switch to shut the flow of the exciting current when the value of the exciting current detected by the exciting current detector means becomes equal to a threshold value.

5. The apparatus according to claim 1, wherein said first unit has two scrubber means.

6. The apparatus according to claim 1, wherein said second unit has two turning means.

7. The apparatus according to claim 6, wherein said means for aligning the substrate is attached only to one of the turning means.

8. An apparatus for washing a substrate, comprising:

scrubber means for scrubbing a single surface of the substrate;

a first unit having the scrubber means disposed therein; turning means, having a horizontal holding shaft for holding the substrate substantially horizontal, for turning the substrate about the horizontal holding shaft to cause front and back surfaces of the substrate to face upward alternatively;

a stage movable in a vertical direction and having a substrate supported thereon in substantially a horizontal direction;

a second unit having the turning means and stage disposed therein, the stage being movable in the vertical direction within the unit; and carrier means for carrying the substrate between the first and second units;

wherein the front surface of the substrate is scrubbed by the scrubber means;

the substrate is carried by the carrier means from the first unit to the second unit;

the substrate is disposed on the stage;

the stage is moved downward to transfer the substrate from the stage to the turning means;

the substrate is turned upside down by the turning means;

the stage is moved upward to transfer the substrate from the turning means to the stage; and the back surface of the substrate is scrubbed by the scrubber means.

9. A method for washing a substrate comprising the steps of:

preparing an apparatus for washing a substrate, the apparatus comprising scrubber means for scrubbing a single surface of the substrate, a first unit having the scrubber means disposed therein, turning means, having a horizontal holding shaft for holding a substrate substantially horizontal, for turning the substrate about the horizontal holding shaft to cause the front and back surfaces of the substrate to face upward alternatively, a stage being movable in a vertical direction and having a substrate supported thereon in substantially a horizontal direction, a second unit having the turning means and stage disposed therein, and carrier means for carrying the substrate between the first and second units;

scrubbing the front surface of the substrate by the scrubber means;

carrying the substrate by the carrier means from the first unit to the second unit;

disposing the substrate on the stage;

moving the stage downward to transfer the substrate from the stage to the turning means;

turning the substrate upside down by the turning means;

moving the stage upward to transfer the substrate from the turning means to the stage; and scrubbing the back surface of the substrate by the scrubber means.

10. The method according to claim 9, further comprising the steps of:

preparing a spin chuck mounted below the stage such that, when the stage is moved downward, the spin chuck passes smoothly through a central opening of the stage so as to attract the substrate thereon, means for rotating the spin chuck, a photosensitive sensor for detecting whether or not an orientation flat of the substrate is aligned, and control means for controlling the rotating means based on a signal generated from the photosensitive sensor;

moving the stage downward to cause the top portion of the spin chuck to pass through the central opening of the stage so as to be brought into contact with the substrate;

allowing the spin chuck to attract the substrate; and rotating the substrate on a horizontal plane while detecting the direction of the substrate by a photosensitive sensor.

* * * * *